United States Patent

Yeh et al.

[11] Patent Number: 6,022,785
[45] Date of Patent: Feb. 8, 2000

[54] METHOD OF FABRICATING A METAL-OXIDE-SEMICONDUCTOR TRANSISTOR

[75] Inventors: Wen-Kuan Yeh, Chupei; Tony Lin, Kaohsiung Hsien, both of Taiwan

[73] Assignee: United Microelectronics Corp., Taipei, Taiwan

[21] Appl. No.: 09/126,462

[22] Filed: Jul. 30, 1998

[30] Foreign Application Priority Data

Jun. 15, 1998 [TW] Taiwan ................................. 87109468

[51] Int. Cl.[7] ........................ H01L 21/336; H01L 21/425
[52] U.S. Cl. ............................... 438/305; 438/527
[58] Field of Search ........................... 438/301, 305, 438/307, 309, 314, 527, 496, 303, 306, 442

[56] References Cited

U.S. PATENT DOCUMENTS 5,595,919  1/1997  Pan ............................................ 437/29
5,770,508  6/1998  Yeh et al. ............................... 438/305

Primary Examiner—David Nelms
Assistant Examiner—Brad Smith
Attorney, Agent, or Firm—Thomas, Kayden, Horstmeyer & Risley

[57] ABSTRACT

The invention discloses a method of forming a metal-oxide-semiconductor transistor. The method provides a substrate, where a gate structure is formed thereon. Next, a first spacer is formed on the sidewall of the gate structure. A pair of heavily doped regions is formed in the substrate. Then, an annealing process is performed to make the doped ions in the heavily doped regions uniformly distributed. Next, the first spacer is removed and a thin pad dielectric layer is formed over the substrate. Next, a first type halo structure is formed in the bottom portion of the source/drain region beneath the gate structure. A lightly doped region is formed between the gate structure and the first type halo structure and above the first type halo structure. An etching process is performed on the pad dielectric layer to form a second spacer and then the MOS transitor is completed.

6 Claims, 2 Drawing Sheets

METHOD OF FABRICATING A METAL-OXIDE-SEMICONDUCTOR TRANSISTOR

CROSS-REFERENCE TO RELATED APPLICATION

This application claims the priority benefit of Taiwan application serial no. 87109468, filed Jun. 15, 1998, the full disclosure of which is incorporated herein by reference.

BACKGROUND OF THE INVENTION

1. Field of Invention

The present invention relates to a method of a fabricating metal-oxide-semiconductor (MOS) transistor. More particularly, the present invention relates to a method of fabricating a MOS transistor capable of increasing pad area size as well as improving alignment accuracy in subsequent processes.

2. Description of Related Art

A MOS transistor is a basic device in an integrated circuit. A MOS transistor unit comprises a gate structure, a source region and a drain region, wherein the gate structure includes a metallic layer and an oxide layer. In general, the metallic layer is made from a material having properties very close to silicon such as polysilicon, and the oxide layer is made from silicon dioxide ($SiO_2$). The source/drain regions are formed in a substrate on either side of the gate structure.

The MOS transistor possesses n-type, p-type and complementary semiconductors, therefore, some doping processes are introduced to the MOS transistor. The implanted ions are called dopants. In the recent fabricating process for VLSI (Very Large Scaled Integrated) circuits, the main techniques for doping are, for example, a conventional method of diffusion or an advanced method of ion implantation. The method of diffusion depends on the mobility of dopants at high temperature, for example, about 800° C. In the host of the semiconductor, the dopants are moved from a region with high concentration toward a region with low concentration to proceeding the doping treatment. The method of ion implantation is using ions as dopants that are implanted into the semiconductor device by promoting the energy of the ions.

The conventional methods for doping are proceeding at a high temperature. When the integration of the integrated circuits is increased, the accompaniment is that depth of a well in the devices and junction depth of the source region and the drain region are both decreased. However, the conventional methods for doping can not precisely control the distribution and profile of both the depth of the well and the junction depth. The ion implantation provides a preferred dopant profile and an advantage of easily controlling the concentration of implanted dopants. Therefore, the ion implantation is a main technique for doping in the modern fabricating method of VLSI devices.

FIGS. 1A–1C show cross-sectional views of forming a p-type metal oxide semiconductor transistor by a method of ion implantation. At first, referring to FIG. 1A, a gate structure 102 is formed over active area in the substrate 100. An implant treatment is performed over the substrate 100 by using, for example, the boron for doping. The gate structure 102 acts as a mask to prevent the boron from penetrating the substrate 100 in the active area. The concentration for the implantation is not higher than, for example, about $10^{13}$ atoms/$cm^2$. The implanted region is so-called lightly doped drain (LDD) region 104. The LDD region 104 is used for prevent a short channel effect. The implant treatment is called P-implantation by those persons who skill in the art.

Owing to the ion implantation, bonding structures of a portion of the surface of the substrate 100 are damaged. Therefore, the substrate 100 is treated by an annealing process in a thermal diffusion furnace at about 900° C. to 1000° C., and the implanted borons are simultaneously diffused.

Next, a spacer 106 is formed around the sidewall of the gate structure 102, as shown in the FIG. 1B. A further $P^+$ implant treatment is introduced on the substrate 100 by using the gate structure 102 and the spacer 106 as a mask and using, for example, the borons as dopants. The concentration for the implantation is high, for example, is about $10^{15}$ atoms/$cm^2$ and the depth of the implantation is deep. A heavily doped drain region 104a is then formed beneath the LDD region 104. The substrate 100 is then treated again by an annealing and diffusion process, to repair the damaged surface of the substrate 100 and make the doped ions distributed well. The heavily doped drain region 104a is used for a main body of a source/drain region for further processing. The heavily doped drain region 104a is also used for avoid a leakage phenomenon in a following process of forming self-alignment silicide, owing to a characteristic of deeper region in the heavily doped drain region 104a.

The metal oxide semiconductor transistor formed by the conventional fabricating method has lightly doped drain regions (LDD), which can inhibit a short-channel effect and avoid a punchthrough phenomenon, which happens in the source/drain region of the semiconductor substrate, induced by applying a high voltage. The heavily doped drain region is necessary for a further process of salicidation. However, there are some restrictions in the conventional methods:

(1). For avoiding the short channel effect, the depth of the implanted ions is restricted to be very close to the surface of the semiconductor substrate while proceeding the lightly doping process. However, the controlling of the depth of the implantation is not easy. A profile of the distribution region of the implanted ions is easily changed while performing an annealing process and a thermal diffusion in the following process, that is, the profile is easily diffused and make the short channel effect happening again.

(2). It is uneasy to control a thermal budget, which is used for performing a p-type lightly doping process, for example, using $BF_2$ or a N-halo process.

In light of the foregoing, there is a need to provide a relatively simple method of manufacturing high dielectric constant dielectric layer.

SUMMARY OF THE INVENTION

Accordingly, the present invention is to provide a method of forming a metal-oxide-semiconductor transistor, which the profile of the heavily doped source/drain region of the transistor does not cause the short channel effect after the annealing process.

Accordingly, the present invention is to provide a method of forming a metal-oxide-semiconductor transistor, which the implanting process is easily controlled to form shallow lightly doped regions in the source/drain region of the transistor.

Accordingly, the present invention is to provide a method of forming a metal-oxide-semiconductor transistor, which sheet resistance induced in the source/drain region is comparatively low and the drive ability of the electrons in the source/drain region is then strengthened.

Accordingly, the present invention is to provide a method of forming a metal-oxide-semiconductor transistor, which during the ion implanting the surface of the substrate is prevented from bombardment of the implanting ions. The high-temperature annealing process for fixing the damaged surface of the substrate is unnecessary. A shallow lightly doped region of better characteristic is also formed in the substrate.

To achieve these and other advantages and in accordance with the purpose of the invention, as embodied and broadly described herein, the invention provides a method of forming a metal-oxide-semiconductor transistor. The method comprises, at first, providing a substrate, where a gate structure is formed thereon. Next, a first spacer is formed on the sidewall of the gate structure. A pair of heavily doped regions are formed in the substrate beneath and beside the gate structure by performing a process of ion implantation with first type ions. Then, an annealing process is performed to make the doped ions in the heavily doped regions uniformly distributed, wherein the profile of the heavily doped region is expand to the portion of the substrate beneath the first spacer. Next, the first spacer is removed and a thin pad dielectric layer is formed over the substrate. Next, a first type halo structure is formed in the bottom portion of the source/drain region beneath the gate structure by implanting second type ions through the pad dielectric layer into the substrate. A lightly doped region is formed between the gate structure and the first type halo structure and above the first type halo structure by implanting first type ions through the pad dielectric layer into the substrate. An etching process is performed on the pad dielectric layer to form a second spacer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
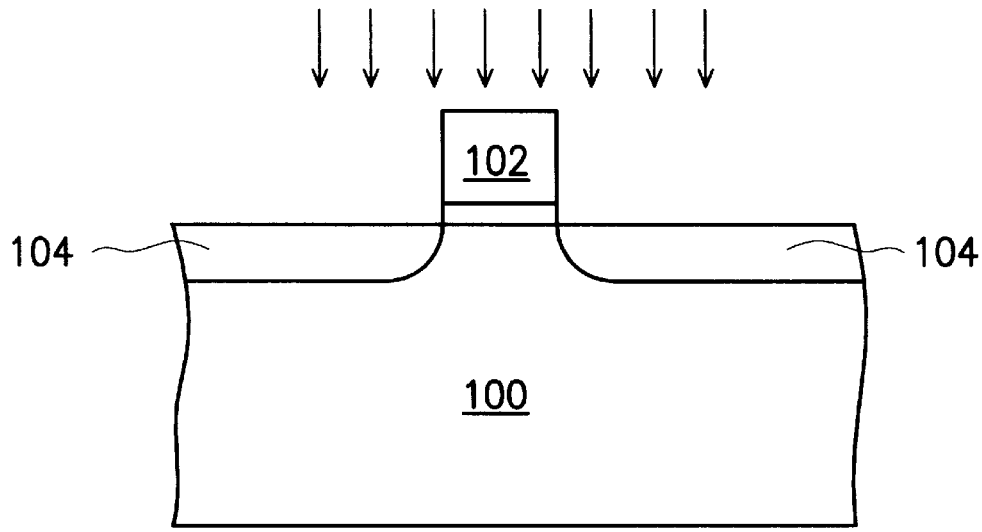
FIGS. 1A–1C show cross-sectional views of forming a p-type metal oxide semiconductor transistor by a method of ion implantation.
Figure 1B:
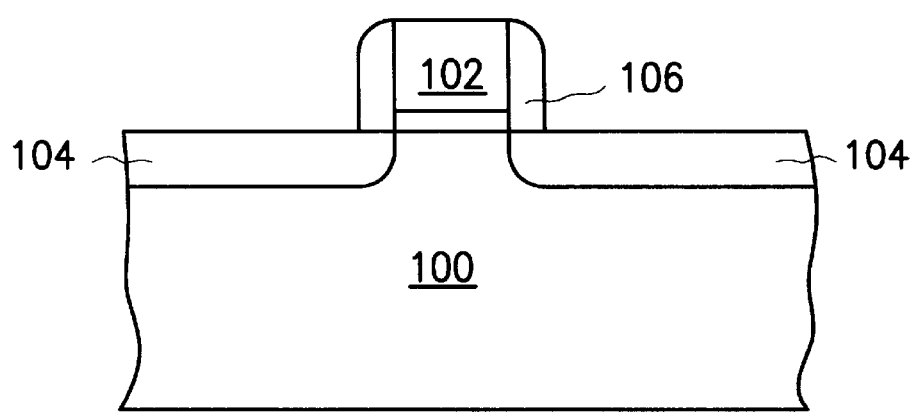
Figure 1C:
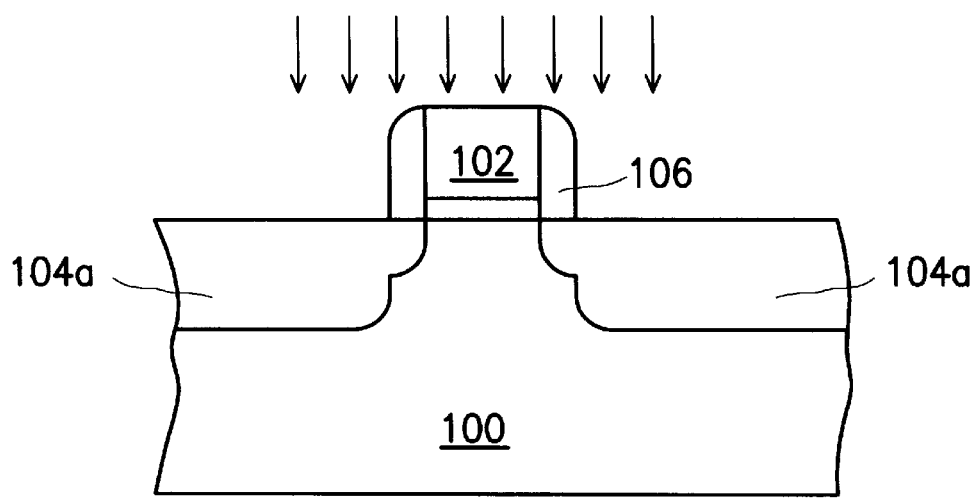

Reference will now be made in detail to the present preferred embodiments of the invention, examples of which are illustrated in the accompanying drawings. Wherever possible, the same reference numbers are used in the drawings and the description to refer to the same or like parts.

Figure 2A:
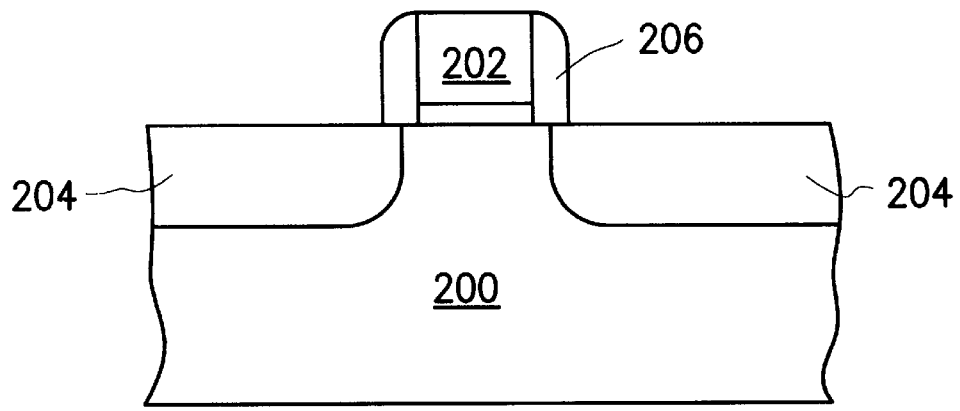
FIGS. 2A–2C show cross-sectional views of forming a metal oxide semiconductor transistor by a method of ion implantation according to a preferable embodiment of the invention.
Figure 2B:
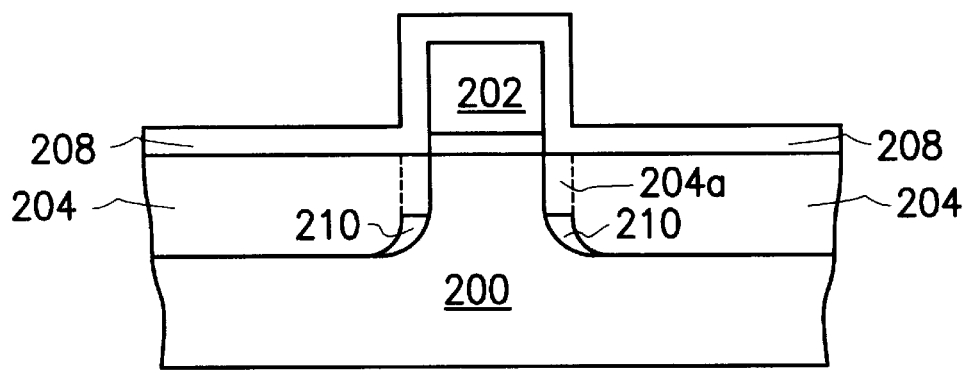
Figure 2C:
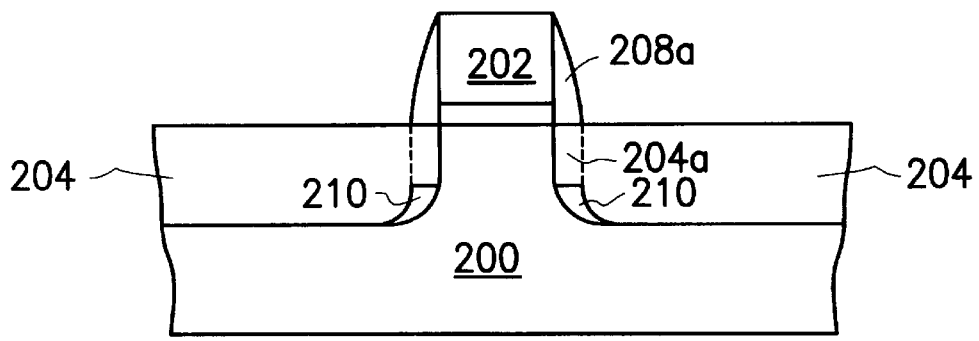

FIGS. 2A–2C show cross-sectional views of forming a metal oxide semiconductor transistor by a method of ion implantation according to a preferable embodiment of the invention. Referring to FIG. 2A, a gate structure 202 is formed over a substrate 200 and a first spacer 206 is formed around the gate structure 202. The first spacer 206 is composed of, for example, silicon nitride. Next, the substrate 200 is then heavily doped with dopants of high concentration by an ion implantation process to form a heavily doped source/drain regions 204.

Owing to the isolation of the first spacer 206, the portion of the substrate 200 under the cover of the first spacer 206 is not doped with any dopant. The implanted ions are preferably p-type. The substrate 200 is then performed by an annealing and thermal diffusion process, by which the concentration of the doped ions in the heavily doped source/drain region 204 is uniformly distributed. The profile of the heavily doped source/drain region 204 is also expanded by diffusion of the doped ions induced by the thermal diffusion process. The portion of the substrate 200 under the cover of the first spacer 206 is then somewhat distributed with doped ions, as referred with 204'.

Next, as shown in FIG. 2B, the first spacer 206 is then removed. A thin pad dielectric layer 208 is formed over the substrate 200 by, for example, a method of chemical vapor deposition. The pad dielectric layer 208 is composed of, for example, silicon dioxide or silicon nitride. A halo structure is then formed beneath the gate structure 202. The details are described hereinafter. Because the heavily doped source/drain region 204 is p-type, n-type ions are introduced in the forming steps of the halo structure. The n-type ions with high energy are implanted into a bottom portion of the heavily doped source/drain region 204 close to the gate structure 202 by penetrating the pad dielectric layer 208 on the sidewall of the gate structure 202, by which a p-halo structure 210 with n-type ions is then formed therein.

Next, the portion of the substrate 200 between the p-halo structure 210 and the pad dielectric layer 208 is lightly doped with p-type ions with lower energy by penetrating the pad dielectric layer 208, by which a lightly doped region 204a is then formed above the p-halo structure 210. Next, referring to FIG. 2C, the thin pad dielectric layer 208 is etched by a method of anisotropic etching to expose the surface of the substrate 200, by which a second spacer 208a is then formed on the sidewall of the gate structure 202. In the following step, a self-aligned process is performed on the substrate 202 by depositing a titanium layer over the substrate to form self-aligned silicide in the substrate 202.

In the embodiment above described, the forming steps of the p-type lightly doped region and the p-halo structure beneath the gate structure can be easily modified to form a n-type lightly doped region and a p-halo structure by some person skilled in the art without departing from the scope or spirit of the invention. If the doped ions in the heavily doped source/drain regions of a device is n-type, the dopants for forming the n-halo structure are p-type, and the dopants for forming the lightly doped region is n-type.

There are some advantages disclosed in the invention, which are described hereinafter:

(1). During the performing of ion implantation according to the invention, a thick first spacer is used for isolation layer and a substrate is heavily implanted and a deeper heavily doped source/drain region is formed therein. The substrate is then performed by an annealing and thermal diffusion process, by which the concentration of the doped ions in the heavily doped source/drain region is uniformly distributed. Next, implanting ions through a pad dielectric layer then forms a lightly doped region. The further annealing process is unnecessary for the following steps to make the doped ions uniformly distributed. The profile of the heavily doped source/drain region does not cause the short channel effect after the annealing process.

(2). Before performing a lightly doping process, a thin pad dielectric layer is first deposited over the substrate. The implanting process is easily controlled to form shallow lightly doped regions in the source/drain region of the device.

(3). Because the deposited pad dielectric layer is thin, the spacer formed in the sequent step is therefore considerably thin, that is, sheet resistance induced in the source/drain region is comparatively low, by which the drive ability of the electrons in the source/drain region is then strengthened.

(4). In view of the damages caused by the ion implantation to the surface of the semiconductor substrate, the pad dielectric layer deposited over the substrate has a function for preventing the surface of the substrate from being damaged. During the ion implanting, the pad dielectric layer can prevent the surface of the substrate from bombardment of the implanting ions. The high-temperature annealing process for fixing the damaged surface of the substrate is unnecessary. A shallow lightly doped region of better characteristic is also formed in the substrate.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a metal-oxide-semiconductor transistor, comprising:

providing a substrate, where a gate structure is formed thereon;

forming a first spacer on the sidewall of the gate structure;

performing a process of ion implantation with first type ions to form a pair of heavily doped regions in the substrate beneath and beside the gate structure;

performing a annealing process to make the doped ions in the heavily doped regions uniformly distributed, wherein the profile of the heavily doped region is expand to the portion of the substrate beneath the first spacer;

removing the first spacer;

forming a thin pad dielectric layer over the substrate;

implanting second type ions through the pad dielectric layer into the substrate to form a first type halo structure in the bottom portion of the source/drain region beneath the gate structure;

implanting first type ions through the pad dielectric layer into the substrate to form a lightly doped region between the gate structure and the first type halo structure and above the first type halo structure by; and performing an etching process on the pad dielectric layer to form a second spacer.

2. The method of claim 1, wherein the first type is p-type and the second type is n-type.

3. The method of claim 1, wherein the first type is n-type and the second type is p-type.

4. The method of claim 1, wherein the first spacer is composed of silicon nitride.

5. The method of claim 1, wherein the pad dielectric layer is composed of silicon nitride.

6. The method of claim 1, wherein the etching process is an anisotropic etching process.

* * * * *